(12) United States Patent
Kok et al.

(10) Patent No.: US 7,405,606 B2
(45) Date of Patent: Jul. 29, 2008

(54) D FLIP-FLOP

(75) Inventors: Chi Wah Kok, Hong Kong (CN); Yee Ching Tam, Hong Kong (CN)

(73) Assignee: Intellectual Ventures Fund 27 LLC, Las Vegas, NV (US)

( * ) Notice: Subject to any disclaimer, the term of this patent is extended or adjusted under 35 U.S.C. 154(b) by 0 days.

(21) Appl. No.: 11/397,880

(22) Filed: Apr. 3, 2006

(65) Prior Publication Data
US 2007/0229133 A1 Oct. 4, 2007

(51) Int. Cl.
*H03K 3/289* (2006.01)

(52) U.S. Cl. .................. 327/202; 327/203; 327/208; 327/210; 327/211; 327/212; 327/218; 326/95; 326/98

(58) Field of Classification Search .................. 327/202, 327/203, 208, 210–212, 214, 218, 219; 326/93–98
See application file for complete search history.

(56) References Cited

U.S. PATENT DOCUMENTS

| | | | | |
|---|---|---|---|---|
| 6,198,324 B1 * | 3/2001 | Schober | ...................... | 327/202 |
| 6,646,487 B2 * | 11/2003 | Nedovic et al. | ............. | 327/211 |
| 6,646,492 B2 * | 11/2003 | Park et al. | ..................... | 327/530 |
| 6,703,881 B2 * | 3/2004 | Lu | .............................. | 327/203 |
| 6,753,714 B2 * | 6/2004 | Gupta | ......................... | 327/202 |
| 7,167,033 B2 * | 1/2007 | Arima et al. | ................. | 327/208 |
| 7,248,090 B2 * | 7/2007 | Ramprasad | ................. | 327/202 |
| 7,256,633 B1 * | 8/2007 | Rafiq | .......................... | 327/202 |
| 7,265,599 B1 * | 9/2007 | Pasqualini | ................... | 327/202 |

FOREIGN PATENT DOCUMENTS

JP    04026222 A   *   1/1992

* cited by examiner

*Primary Examiner*—N. Drew Richards
*Assistant Examiner*—Patrick O'Neill
(74) *Attorney, Agent, or Firm*—Schwabe, Williamson & Wyatt, P.C.

(57) ABSTRACT

A D flip-flop with a reduced power product or reduced clock line capacitance is disclosed. The flip-flop includes a half-static slave stage or a master stage with clock gating by the input and output. The half-static slave stage an output inverter and a feedback element consisting of a single switching transistor having a gate connected to the output of the flip-flop and the input of the inverter as its load. The clock gating circuit, which may comprise an XNOR gate, reduces the frequency of switching events by permitting clock pulses to pass into the master or slave stage only when the input and output of the flip-flop are at the same logical state.

21 Claims, 4 Drawing Sheets

D FLIP-FLOP

BACKGROUND

Flip-flops are indispensable in digital logic design. The flip-flop itself can also be regarded as a one-bit memory circuit. There are several kinds of flip-flops. In particular, a D flip-flop accepts an input and generates an output with the same value of the accepted input when it is triggered by a clock signal. Power consumption has been one of the greatest concerns for all designers when designing a flip-flop, since it is widely in use and contributes a significant portion of the total power consumption in digital circuits. In practice, the performance of a D flip-flop is commonly measured in terms of power delay product, which is the product of the average power consumption and the propagation delay measured from the triggering point of the clock signal to the occurrence of the output signal corresponding to the input signal right before the triggering edge of the clock.

FIG. 1 shows a conventional master-slave D flip-flop 100. Each of the master stage 110 and slave stage 120 has a pass gate and a memory element. The pass gate is a transmission gate driven by a clock signal. In a conventional D flip-flop, the external clock signal typically does not drive the transmission gate directly, because that will increase the capacitance of the external clock line, which is undesirable in large circuits, as large clock line capacitance will cause clock skew problem. Instead, the external clock CLK is buffered by inverting the external clock signal CLK twice with inverters Inv1.1 and Inv1.2. The memory element in each stage is formed by a feedback loop of two inverters (Inv 1.3 and Inv1.4 in the master stage, and Inv1.5 and Inv1.6 in the slave stage) and is controlled by another pass gate (pass gate 1.2 in the master stage, and pass gate 1.4 in the slave stage). When the pass gate is turned on, the feedback path is completed and the two inverters form a latch, which can serve as memory. When the clock signal CLK is low, the pass gate 1.2 will break the loop of the master memory, while the input signal D will pass through pass gate 1.1 and complete the memory write action onto the master memory at the same time. The signal written into the master memory equals to the signal D right at the moment of the rising edge of the CLK signal. When the CLK signal is high, the two stages are connected together by the pass gate 1.3. At the same time, the pass gate 1.4 will break the loop of the slave memory. As a result, the signal that has been written into the master memory will pass through the pass gate 1.3 and complete the memory-write action onto the slave memory. When the CLK signal is low again, the slave stage is isolated from the master stage and the signal is passed to the slave stage and is stored in its latch formed by Inv1.5 and Inv1.6. Such D flip-flop is known as rising edge triggered master slave D flip-flop. D flip-flop with other triggering type can be constructed similarly in the hands of the skilled engineers.

The reduction of the power consumption of the conventional master slave D flip-flop has been extensively investigated in the literature. An effective way to reduce the power consumption is to use dynamic circuit to construct the master flip-flop and simplify the static circuit of the slave flip-flop 200 as shown in FIG. 2. The master stage 210 in FIG. 2 replaces the pass gate 1.1 in FIG. 1 by a switching transistor M2.1, which is controlled by a complemented CLK signal. The feedback inverter Inv1.4 of the memory element is eliminated. In this case, the storage function is performed by the dynamic memory element constructed by the parasitic capacitor of the output of Inv2.3. The pass gate 1.2 is replaced by transistor M2.2, which is used to turn on and off the inverter Inv2.3 to complete the memory write action. Comparing to the conventional master stage as shown in FIG. 1, the one in FIG. 2 has fewer device count and smaller clock load, thus consumes less power. The slave stage 250 is similar to the conventional one, but the two transmission gates pass gate 1.3 and pass gate 1.4 in FIG. 1 are reduced from two transistors to one with switching transistor M2.3 so that the device count is further reduced and the two phase clock is not required as contrast to that in FIG. 1. However, using switching transistor may reduce output voltage across the transistor. In the other words, it would require additional power to pull the output voltage back to VDD, where VDD is the supply voltage of the D flip-flop, which is the logic 1 voltage representation in digital logic. Otherwise the circuit will be operated with reduced noise margin. To remedy the problem, inverter Inv2.3 is added to the master stage. When D is at logic 1, node x1 has a voltage of VDD-VT, where VT is the threshold voltage of the transistor M2.1. To compensate for the reduced voltage at node x1, the transistor sizes of inverter Inv2.3 is adjusted such that its noise margin is wide enough to accommodate the voltage drop at node x1. In this case, the switching transistor M2.3 of the slave stage does not suffer from the voltage drop problem and can maintain a strong driving capability to push a large output latch. At the latch of the slave stage, a weak feedback inverter Inv2.5 is used so that switching transistor M2.3 can write a different signal into the latch by using a small power.

SUMMARY

This application relates to master slave D flip-flops. It more specifically relates to clock gating half-static master slave D flip-flops that improves the power delay product of the D flip-flops.

To further reduce the power delay product, in one embodiment of the invention, a half-static master-slave D flip-flop design technique is used. The disclosed D flip-flop applied a number of power saving techniques to reduce the power delay product, which includes a half-static slave stage with fewer device count and faster logic-1-to-logic-0 transition, and a clock gating circuit that reduces the input data activity. The half-static slave stage eliminates one of the pull down transistors of the output buffer, so that the transition of output Q from logic 1 to logic 0 is faster. The clock gating circuit is accomplished by XNOR function with the input signal D and the output signal Q. When the two signals are identical, the XNOR gate disables the CLK signal. When the two signals are different, the XNOR gate enables the CLK signal to complete the write action. Using the clock gating technique, the flip-flop will only change its state when D and Q are different. The total switching events and the associated power consumption due to transistor switchings are reduced as a result.

DESCRIPTION OF ILLUSTRATIVE EMBODIMENTS

Figure 1:
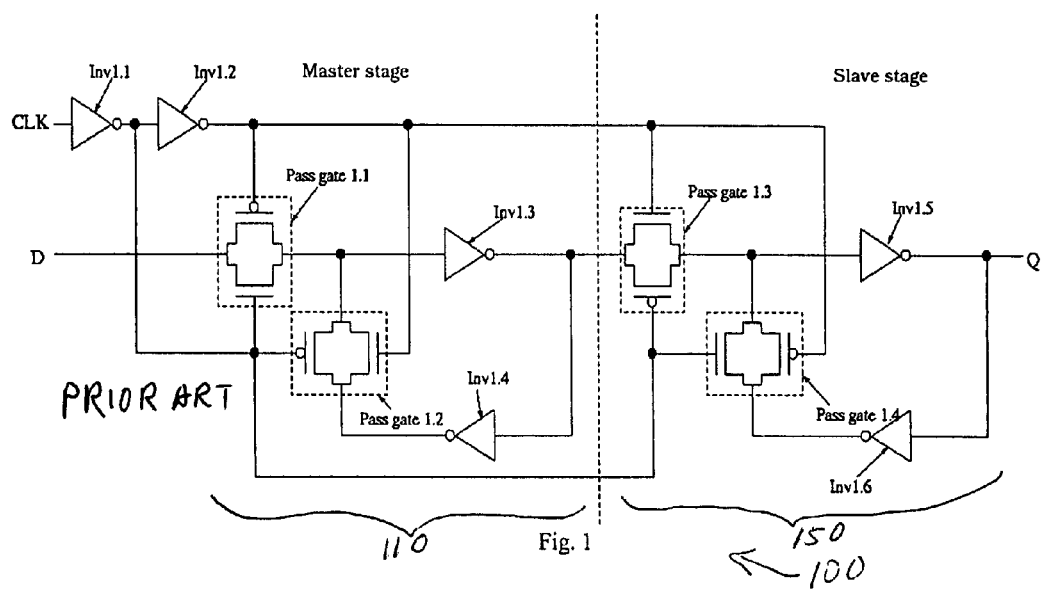
FIG. 1 shows a conventional D flip-flop with similar master and slave stage.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

Figure 2:
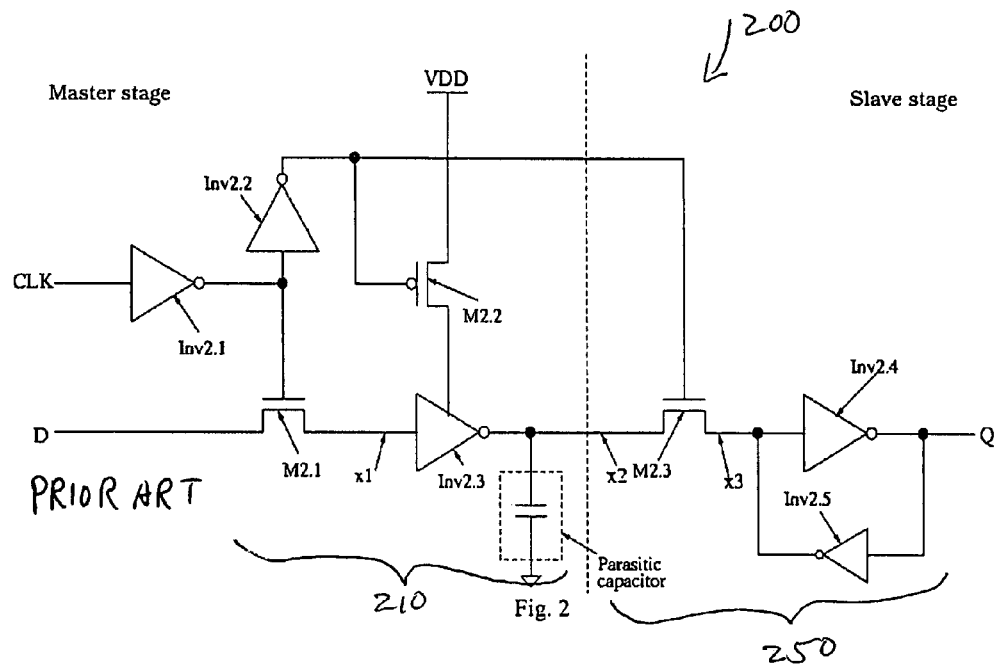
FIG. 2 shows a flip-flop with a dynamic master stage and a simplified slave stage of conventional type.
Figure 3:
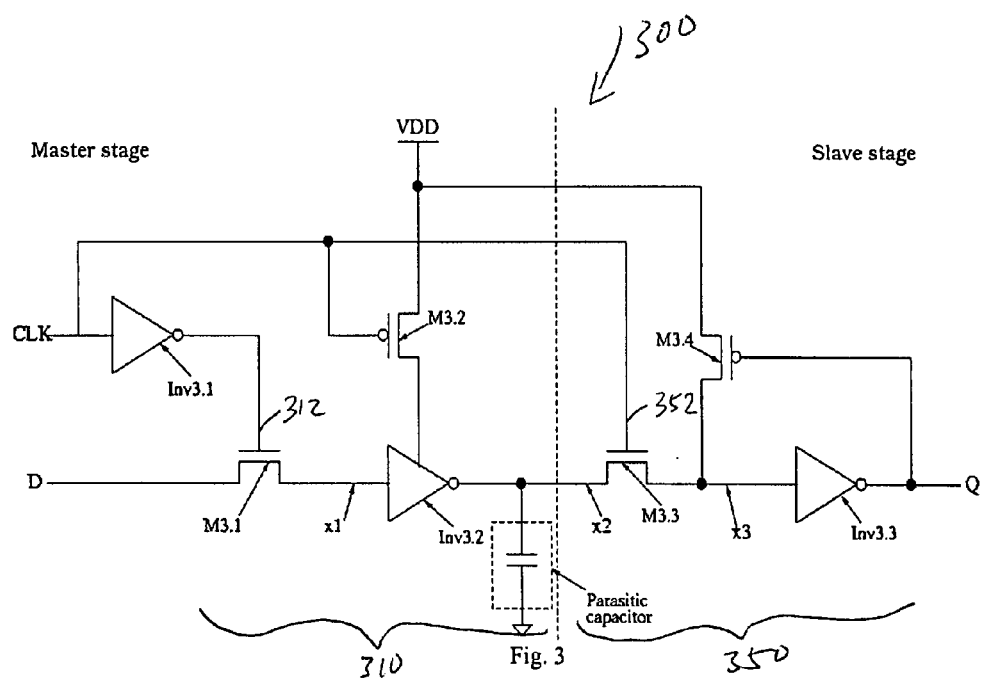
FIG. 3 shows a flip-flop with a dynamic master stage and a half-static slave stage.

In an embodiment, shows in FIG. 3, a master-slave D flip-flop 300 includes a master stage 310 and a slave stage 350. Through the inverter Inv3.1, the clock line 352 of the slave stage 350 is driven by clock pulses that are complements of the clock pulses driving the clock line 312 of the master stage 310. The master stage 310 is similar to the one as shown in FIG. 2. In the present embodiment, Inv2.2 of the master stage in FIG. 2 is removed. Though clock load is increased in this case relative to the case shown in FIG. 2, device count is reduced. Thus, the embodiment shown in FIG. 3 lowers the power consumption of the D flip-flop despite the increase in the power dissipation of the clock network. For the slave stage, although the five-transistor circuit that constructs the slave stage as shown in FIG. 2 can reduce the clock line capacitance, this kind of slave stage operates at slower speed when D transits from logic 1 to logic 0. When D transits from logic 0 to logic 1, node x2 transits from logic 1 to logic 0. The voltage drop across transistor M2.3 does not affect the logic level transition of node x3 and would not slow down the speed of transition. However, when D transits from logic 1 to logic 0, node x2 transits from logic 0 to logic 1. The voltage of node x3 rises relatively slow due to the voltage drop at the output of switching transistor M2.3 and the pull down transistor of the feedback inverter Inv2.5. In the embodiment illustrated in FIG. 3, a D flip-flop is presented where the NMOS pull down transistor of Inv2.5, which in a typical conventional configuration comprises both an NMOS and PMOS) is eliminated (Inv2.5 in FIG. 2 is replaced by the PMOS transistor M3.4 in FIG. 3) so as to speed up the transition of node x3 from logic 0 to logic 1. In this circuit, node x3 is floated when Q is at logic 1 and M3.3 is turned off. As node x3 must be at logic 0 when Q is at logic 1, the leakage problem due to discharging of parasitic capacitance at node x3 is alleviated. Since node x3 is sometimes floating (determined by the output Q), the circuit is half-static. The present embodiment combines a master stage constructed by a dynamic circuit and a half-static slave stage, that has less device count and clock load than that of the conventional master slave D flip-flop as shown in FIG. 1. The slave stage has an advantage of shorter delay for the transition of logic 1 to logic 0 and the entire design consumes less power. Thus, the presented embodiment of the D flip-flop has a smaller power delay product.

To further reduce the power consumption of a flip-flop, we note that power consumption is the highest when transistors switch. There are two kinds of switching activities—clock switching and data switching. In most circumstances, data switching is around one tenth of the clock switching activity. Therefore, clock switching activity uses up most of the power. Obviously, reducing both kinds of switching activity can definitely reduce the power consumption and this can be attained by clock gating technique.

Figure 4:
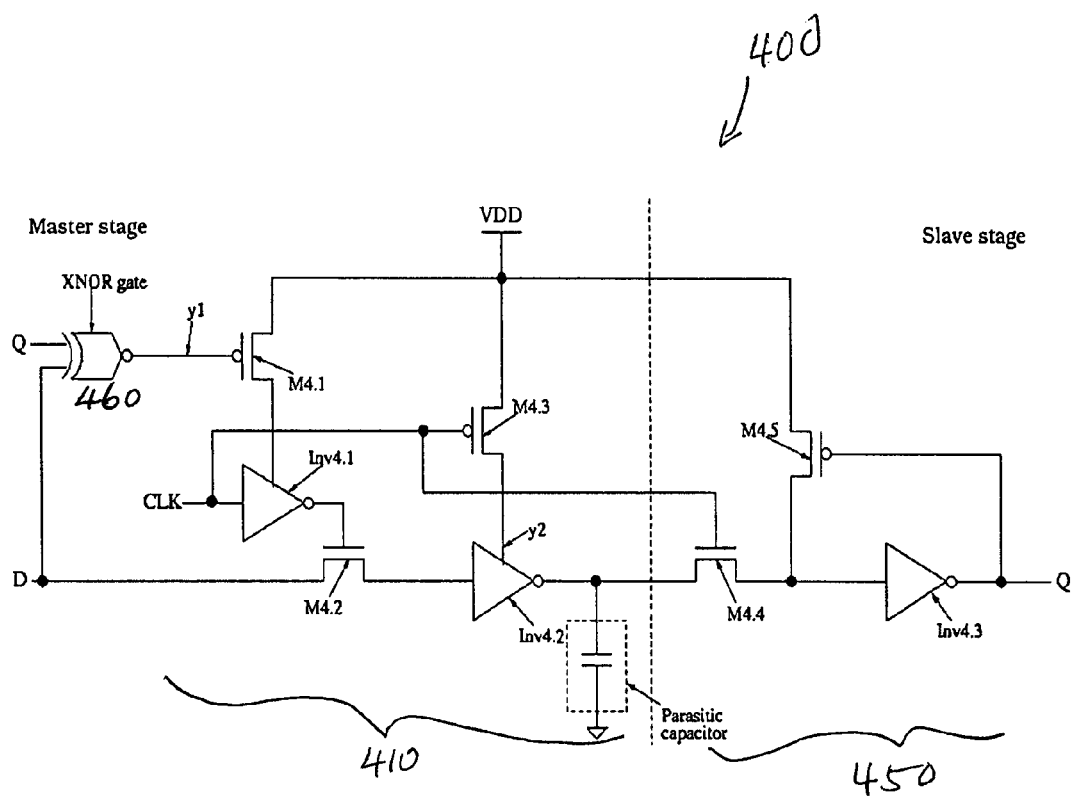
FIG. 4 shows a half-static D flip-flop with clock gating elements.
Figure 6:
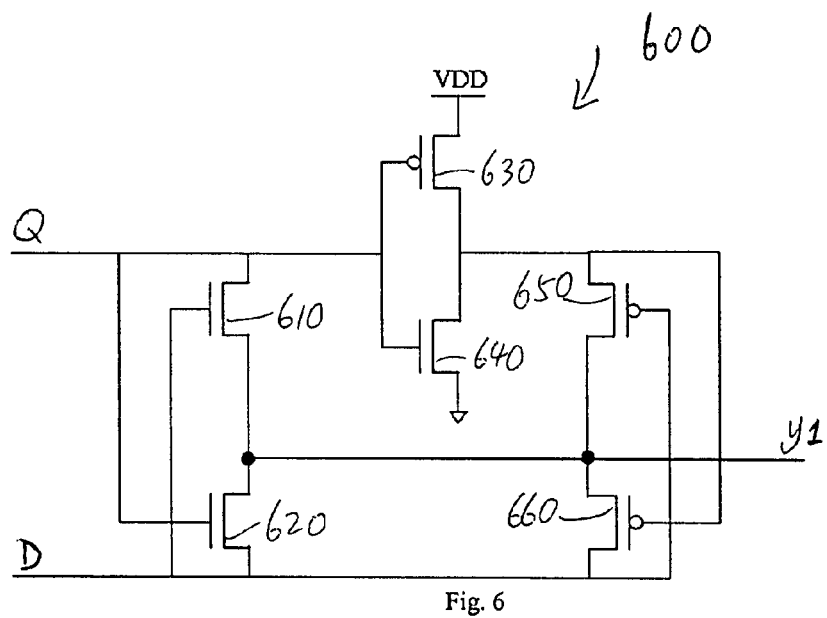
FIG. 6 shows an XNOR gate constructed with 6 transistors applied in embodiments as shown in FIG. 4 and FIG. 5 where the y1=XNOR(D, Q).

FIG. 4 shows a half-static D flip-flop 400 applied with clock gating technique according to another embodiment. It is obtained by adding a clock gating circuit to the half-static flip-flop as shown in FIG. 3. The clock gating circuit comprises of an XNOR gate 460 and a pass device M4.1. In one embodiment, the XNOR can be implemented using six transistors 610, 620, 630, 640, 650 and 660 as shown in FIG. 6. The inputs to the XNOR gate are input D and output Q of the D flip-flop. The pass device M4.1 acts as a switching transistor connecting the XNOR output to the inverter Inv4.1. When D remains unchanged, node y1 is at logic 1, isolating it from VDD. As a result, the N type pass transistor M4.2, which is coupled to the input D, is disabled with the CLK signal being cut off at its gate. When node y1 is at logic 0, the switching transistor M4.1 turns on and connects the VDD to the inverter Inv4.1 and thus powers on the inverter. Complemented CLK signal is coupled to the gate terminal of the switching transistor M4.2 and D is read into the flip-flop. Since inverter Inv4.1 is only powered on when D and Q is different, D can pass into the master stage 410 only when it has a change in logic state. Consequently, the transistor switching activities depends on the change of input instead of CLK switching.

Figure 5:
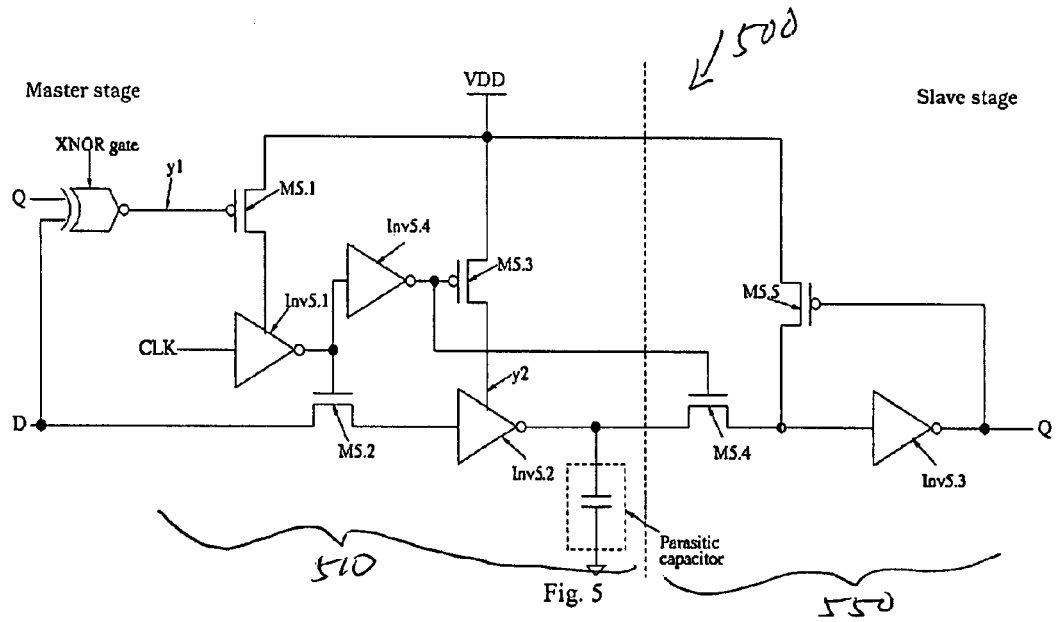
FIG. 5 shows a modification of FIG. 4 with reduced external clock load and total transistor switching activities.

Since the input data activity depends on changing of D, inverter Inv4.2 would not toggle without a change of input data. However, the CLK signal keeps turning the P-type switching transistor M4.3 on and off and charging the node y2. In another embodiment of the flip-flop 500 as shown in FIG. 5, the CLK signal coupled to the P-type switching transistor M5.3 and N-type switching transistor M5.4 of the slave stage 550 is replaced by the gated clock. Since the clock gating circuit has inverted the CLK signal, another inverter Inv5.4 is used to get back the CLK signal and drive the pass device M5.3. This embodiment not only reduces the data input activity but also the clock switching activity of transistor M5.3 and M5.4. The clock line capacitance is also reduced and the problem of unnecessary charging of the node y2 is remedied. However, more transistors are used in this embodiment, therefore more power is consumed when the flip-flop switches state as compared to that in FIG. 4. In average, the power saved in clock gating might be compensated from the power consumption caused by the additional transistors in certain situation. However, in those cases when a low clock line capacitance is desired, such as applications where a low clock skew rate is desired, etc., the disclosed D flip-flop in the present embodiment should be applied.

The half-static D flip-flop in FIG. 3 has fewer components than that of the conventional D flip-flop as shown in FIG. 1 even with the clock gating components. Clock loading is greatly reduced in the new design since transmission gates are replaced by single switching transistors. Though voltage drop occurs across the switching transistor, the element following it can be adjusted such that the voltage drop is well within the noise margin. Also, the clock gating technique prevents unnecessary data input or switching activities. Data is read in only when it is different from the output Q, which greatly reduces switching activity of the circuit. The D flip-flops in the above embodiments are known as rising edge triggered master slave D flip-flops. D flip-flop with other triggering types can be constructed similarly by those skilled in the art.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

The invention claimed is:

1. A D flip-flop, comprising:
a master stage comprising a first data input line, a first clock line, a first data output line, and a storage circuit configured to store a signal applied at the first data input line;
a slave stage comprising a second data input line operatively connected to the first data output line, a second clock line and a second data output line, and further comprising:
a storage circuit; and
a first switching element configured to electrically connect the input terminal of the storage circuit to the second data input line in response to a state of clock signal present on the second clock line, and
a clock gating circuitry comprising
an XNOR gate having two inputs connected to the first data input line and second data output line, respectively, and an output;
a gating switching transistor having a gate connected to the output of the XNOR gate; and
a gating inverter having an input adapted to connect to an external source of clock pulses, and output connected to the first clock line, and an enable input connected to the switching transistor as a load.

2. The D flip-flop of claim 1, wherein
the storage circuit of the slave stage comprising a first inverter having an input end connected to the input terminal and an output end connected to the second data output line, and a second switching element configured to electrically connect the input terminal of the storage circuit to a fixed output voltage source in response to a state of a signal at the second data output line, and
the slave stage being otherwise free of pull-down circuitry electrically connected to the input end of the first inverter.

3. The flip-flop of claim 2, wherein the second switching element consists of a first switching transistor.

4. The flip-flop of claim 3, wherein the first switching transistor comprises a gate connected to the second data output line, and a source-drain region linking the input end of the first inverter to the fixed output voltage source.

5. The flip-flop of claim 4, wherein the first switching transistor is a PMOS transistor having a gate, drain and source, wherein one of the drain and source is connected to the input of the first inverter and the other of the drain and source is connected to a rail voltage supply, and the output of the first inverter is connected to the second data output line and to the gate of the PMOS transistor.

6. The flip-flop of claim 2, wherein the first switching element consists of a second switching transistor.

7. The flip-flop of claim 6, wherein the second switching transistor comprises a gate connected to the second clock line, and a source-drain region linking the input end of the first inverter to the second data input line.

8. The flip-flop of claim 2, wherein the master stage comprises a dynamic flip-flop.

9. The flip-flop of claim 8, wherein the dynamic flip-flop comprises a portion having a capacitance for storing a state of a signal at the first data output line.

10. The flip-flop of claim 8, wherein the dynamic flip-flop comprises a second inverter having an input terminal operatively connected to the first data input line and output terminal connected to the first data output line.

11. The flip-flop of claim 10, wherein the master stage further comprises a third switching transistor having a gate connected to the first clock line, and a source-drain region linking the first data input line to the input terminal of the second inverter.

12. The flip-flop of claim 10, wherein the second inverter further comprises an enable input, the master stage further includes a driving circuitry having a control input and adapted to enable the second inverter via the enable input in response to a state of a signal at the control input.

13. The flip-flop of claim 12, wherein the control input of the driving circuitry is adapted to receive a signal indicative of a signal at the first clock line.

14. The flip-flop of claim 13, wherein the driving circuitry comprises a fourth switching transistor having a gate, and a source-drain region for driving the enable input of the second inverter, and the gate of the fourth switching transistor is operatively connected to the external clock.

15. The flip-flop of claim 14, wherein the driving circuitry comprises a third inverter, the input of the third inverter is connected to the output of the gating inverter and the output of the third inverter is connected to the gate of the fourth switching transistor.

16. The flip-flop of claim 2, wherein the second clock line is adapted to be connected to the external source of clock pulses.

17. A D flip-flop, comprising:
a master stage comprising a first data input line, a first clock line, a first data output line, and a first storage circuit configured to store a signal applied at the first data input line;
a slave stage comprising a second data input line operatively coupled to the first data output line and a second data output line; and
a clock gating circuitry comprising
an XNOR gate having two inputs coupled to the first data input line and second data output line, respectively, and an output;
a gating switching transistor having a gate coupled to the output of the XNOR gate; and
a gating inverter having an input adapted to couple to an external source of clock pulses, and an output coupled to the first clock line, and an enable input coupled to the switching transistor as a load.

18. The flip-flop of claim 17, wherein the master stage further comprises a first inverter having an input terminal operatively coupled to the first data input line and output terminal coupled to the first data output line.

19. The flip-flop of claim 18, wherein the master stage further comprises a first switching transistor having a gate coupled to the first clock line, and a source-drain region linking the first data input line to the input terminal of the first inverter.

20. The flip-flop of claim 19, wherein the master stage further comprises a second switching transistor having a gate, and a source-drain region for driving the enable input of the first inverter, and the gate of the second switching transistor is operatively coupled to the external clock.

21. The flip-flop of claim 20, wherein the master stage further comprises a second inverter, the input of the second inverter is coupled to the output of the gating inverter and the output of the second inverter is coupled to the gate of the second switching transistor.

* * * * *